United States Patent [19]

Shirasaki

[11] Patent Number: 5,073,331

[45] Date of Patent: Dec. 17, 1991

[54] MODULATION METHOD FOR USE IN A SEMICONDUCTOR LASER AND AN APPARATUS THEREFOR

[75] Inventor: Masataka Shirasaki, Setagaya, Japan

[73] Assignee: Fujitsu Limited, Kanagawa, Japan

[21] Appl. No.: 340,010

[22] PCT Filed: Mar. 2, 1989

[86] PCT No.: PCT/JP89/00220

§ 371 Date: Apr. 13, 1989

§ 102(e) Date: Apr. 13, 1989

[87] PCT Pub. No.: WO89/08356

PCT Pub. Date: Sep. 8, 1989

[30] Foreign Application Priority Data

Mar. 4, 1988 [JP] Japan ................................ 63-049803
Jul. 27, 1988 [JP] Japan ................................ 63-185399
Aug. 24, 1988 [JP] Japan ................................ 63-208163

[51] Int. Cl.$^5$ ................................................ H01S 3/10
[52] U.S. Cl. ........................................ 372/26; 372/29; 372/38
[58] Field of Search ............................ 372/26, 29, 38

[56] References Cited

U.S. PATENT DOCUMENTS 4,744,087  5/1988  Nicia ................................. 372/26
4,817,097  3/1989  Dufour ................................. 372/38

FOREIGN PATENT DOCUMENTS 57-112158  7/1982  Japan .
59-43724  10/1984  Japan .
60-235543  11/1985  Japan .
61-212932  9/1986  Japan .
62-189832  8/1987  Japan .

OTHER PUBLICATIONS

Patent Abstracts of Japan, 122 E 579, 1987 & 62-189832, Aug. 19, 1987.
Patent Abstracts of Japan, 47 E 480, 1986 & 61-212932, Sep. 20, 1986.
Patent Abstracts of Japan, 112 P 118, 1982 & 57-24921, Feb. 20, 1986.
Patent Abstracts of Japan, 85 E 136, 1982 & 57-112158, Jul. 13, 1982.

Primary Examiner—James W. Davie
Attorney, Agent, or Firm—Staas & Halsey

[57] ABSTRACT

A method of modulating a semiconductor laser, a method of stabilizing a self-homodyne optical interferometer and a light modulation apparatus using a semiconductor laser is provided for use, for example, in various optical communication systems. To avoid the adverse affect on a semiconductor laser of wavelength chirping and to facilitate high-speed direct modulation, a predetermined short pulse current is superimposed on a bias current to drive a semiconductor laser, thereby phase-modulating the output light at a high speed, eliminating the phase deviation at the output of the light interferometer of the self-homodyne-type and achieving a stable output from the semiconductor laser. The average intensity of the output light is obtained, thereby applying a feedback to a wavelength of the input light or to a difference in an optical path length of the optical interferometer itself in accordance with the average intensity of the output light in order to correct the phase bias when modulating the intensity. To perform a high-speed stable phase intensity modulation, transmission data is subject to sign conversion in accordance with a predetermined rule and thereafter is subject to differentiation. The differentiated signal is superimposed on a constant bias current as a modulating current pulse to drive a semiconductor laser, and the output thereof is intensity-modulated through the self-homodyne optical interferometer.

18 Claims, 12 Drawing Sheets

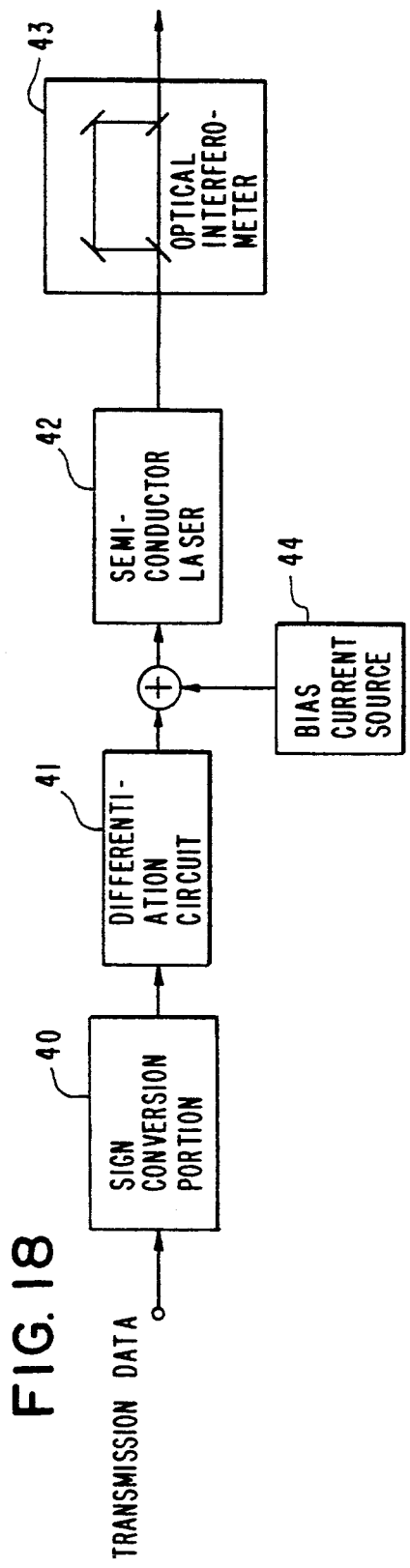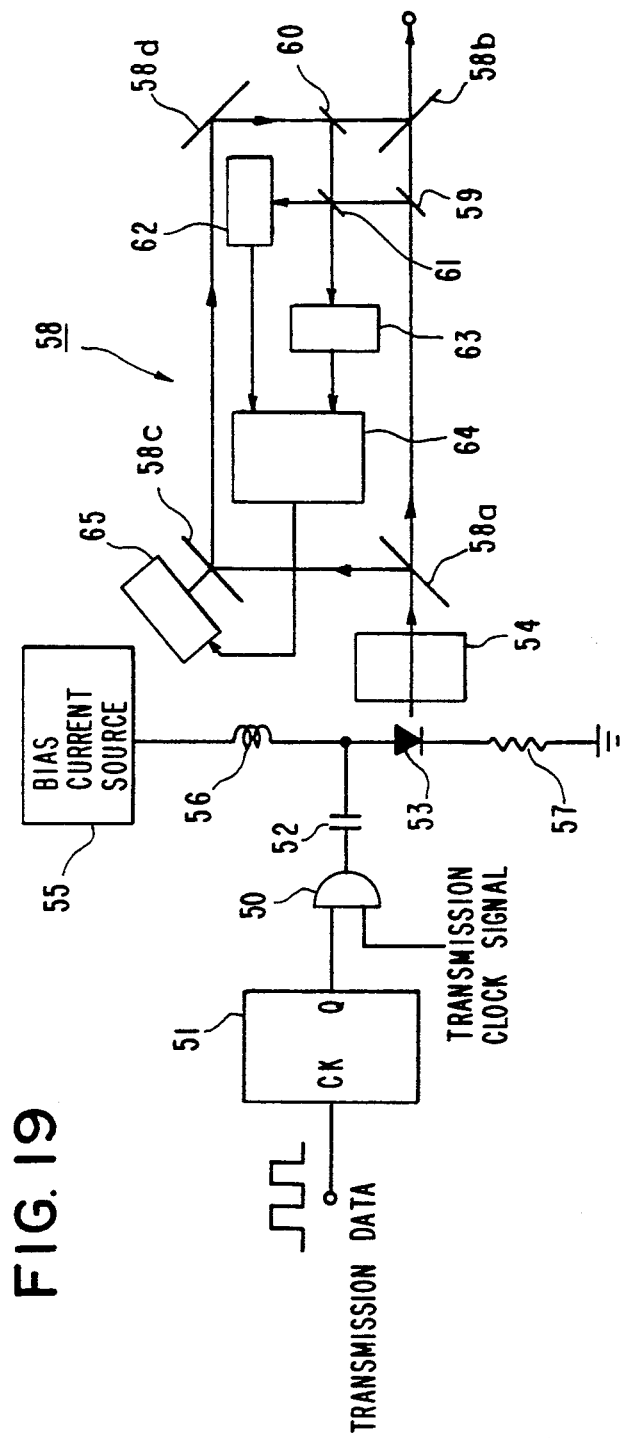

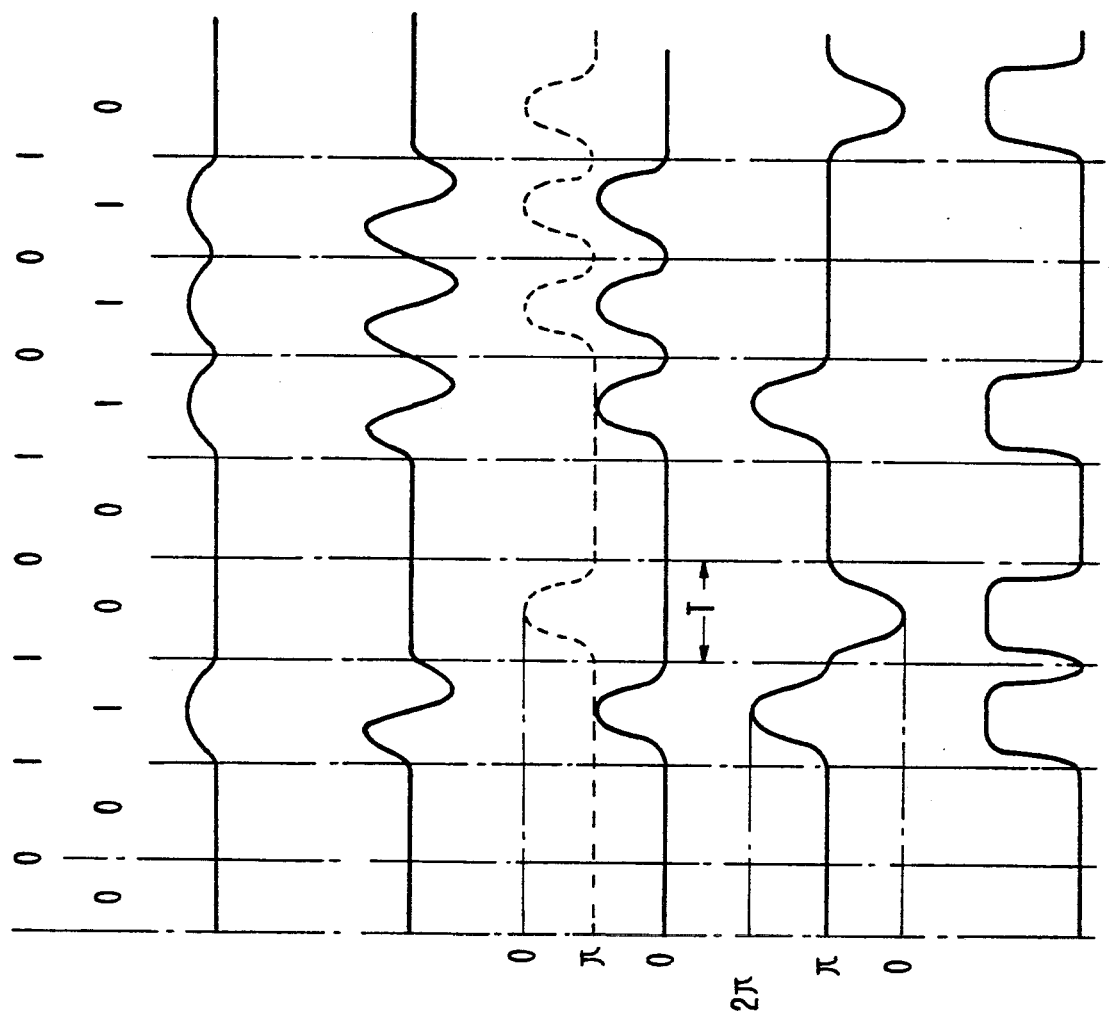

MODULATION METHOD FOR USE IN A SEMICONDUCTOR LASER AND AN APPARATUS THEREFOR

BACKGROUND OF THE INVENTION

1. Technical Field of the Invention

The present invention relates to a semiconductor laser apparatus for use in various optical communication systems and further relates to a method for modulating the semiconductor laser.

2. Description of the Related Art

Semiconductor lasers are frequently used as light-emitting sources in optical communication systems. Modulation methods are basically divided into two types: those for directly modulating a driving current of a semiconductor laser using transmission data, namely, direct modulation methods, and those for indirectly modulating the output light from the semiconductor laser using an external modulator, namely, external modulation methods.

A commonly used prior-art direct modulation system uses a threshold current $I_T$ of a semiconductor laser as a bias current, and superimposes on the bias current a modulation current which is responsive to transmission data, thereby driving the semiconductor laser. In such modulation methods, however, the semiconductor laser must be driven by a pulse current with a relatively large amplitude. This produces chirping (i.e., a dynamic wavelength shift) at an oscillation wavelength, which distorts the wave form of the optical pulse propagating in the optical filter. This causes the problem that it is difficult to conduct direct modulations by using a driving current of high-speed data of several to several tens of Gb/s. Further, as the modulation amplitude is large, a large load is imposed on both the semiconductor laser and the driving circuit thereof.

To decrease such chirping, a constant bias current $I_O$ which is larger by a sufficient margin than the threshold current $I_T$ of the laser, is applied to the modulating current $I_m$, which is typically ±several tens of milliamperes. Thus, a modulation is performed as shown in FIG. 1, using only that current region which is larger than the threshold current $I_T$ of the laser. This method has a big problem in that, even when the transmitting data is '0', a light emission state is maintained, thereby deteriorating the light extinction ratio of the output light.

Prior-art external modulation methods use various kinds of external modulators, such as those using electro-optical-effect material and acoustic-optical-effect material, those of the waveguide path type, and those of the light-deflection type. Therefore, there is a problem that external modulators produce a large loss upon connection, thus necessitating a complicated structure for high-speed modulation.

The structure of an optical interferometer 10 using a commonly used Mach-Zehnder-type electro-optical modulator as the external modulator of the semiconductor laser, is shown in FIG. 2. A constant light beam is input from a semiconductor laser to a single optical waveguide path 1 at the input side of the interferometer 10. This light is divided into two beams which pass two optical waveguide paths 2 and 3. Thereafter these beams are combined to form a single optical waveguide path 4. Electrodes 5 and 6 are provided to the two optical waveguide paths 2 and 3, and the difference in optical path length is varied by applying a suitable voltage to them, thereby creating a phase difference between the two beams to be combined. Thus, the two light beams are caused to interfere with each other upon recombining, producing an output light which is subject to intensity modulation in accordance with the phase difference between the two beams.

Such an optical interferometer 10, however, has the problem that the actual length of the light path varies with temperature, and that the wavelength of an input light itself varies. This causes the phase difference between the two lights to be combined to vary with time, so that a reference point of an operation (a point of phase bias voltage) for an intensity modulation is unstable with time. An ideal relationship between a phase difference and an output light intensity at the time of an intensity modulation, is shown in FIG. 3A. Namely, when the phase difference alternates between $\phi_1$ ($=2n\pi$) and $\phi_2$ ($=(2n+1)\pi$), the output light intensity alternates between "1" and "0". If the phase difference between $\phi_1$ and $\phi_2$ is changed to that between $\phi_{1'}$ and $\phi_{2'}$, the phase bias deviates as shown in FIG. 3B. Thus, the value of the output light intensity even at the maximum is smaller than "1" and the value of the output light intensity even at the minimum is larger than "0", thereby decreasing the light extinction ratio of the output light.

To solve this problem, it is considered that a deviation in the phase difference is detected in the output light and is corrected to eliminate the deviation. However, as the output light is alternated between "1" and "0" at high speed in accordance with a change in phase difference, it is extremely difficult to directly detect the status of a phase from the output light. Therefore, the variation in the phase difference cannot yet be sufficiently suppressed.

SUMMARY OF THE INVENTION

In consideration of the above problems of the prior art, an object of the present invention is to provide a method of modulating a semiconductor laser which eliminates the adverse influence of chirping, and to decrease loads of a semiconductor laser and its driving circuit, thereby enabling a high speed, direct modulation.

In consideration of the problems of the prior art interferometer another object of the present invention is to provide an optical interferometer which can eliminate the phase deviation at the output side and produce a stable output. A further object of the present invention is to provide an optical modulation apparatus which can perform light intensity modulation of the semiconductor laser at a high speed and in a stable manner.

Generally speaking, the oscillation angular frequency $\omega$ of the semiconductor laser can be considered to vary in proportion to the change $\Delta I$ in the current I near the average driving current. This relation is shown in FIG. 6. Namely, when $I(t) = IO + \Delta I(t)$, and $\omega(t) = \omega O + \Delta \omega(t)$, $\Delta \omega(t)$ can be expressed as $$\Delta\omega(t) = k\Delta I(t),$$

where k is a chirping coefficient (constant).

When an optical electric field is represented as $e^{-i(\omega O t + \phi)}$ in a coherent time and where the oscillation angular frequency varies with time as shown above, $$\exp[-i\int^t\omega(t)dt] = \exp[-i\{\omega_0 t + \int^t\Delta\omega(t)dt\}]$$
$$= \exp[-i\{\omega_0 t + k\int^t\Delta I(t)dt\}].$$

In the above equation, as it is expressed that $\phi = k\int^t \Delta I(t)dt$, it is found that the phase $\phi$ can be controlled by a change, $\Delta I$, in the driving current.

Therefore, in the method of modulating the semiconductor laser according to the present invention, the change $\Delta I(t)$ in the driving current is used as a modulation current pulse. The product of a time integral for a single time slot T of $\Delta I(t)$ $$\left( \int_{t_0}^{t_0 + T} \Delta I(t)dt \right)$$

and a chirping coefficient (k) is determined to be $\pi$ or $-\pi$. Namely, $$k \int_{t_0}^{t_0 + T} \Delta I(t)dt = \pi \text{ or } -\pi. \quad (1)$$

When equation (1) is established, the phase $\phi$ is reversed by $\pi$ or $-\pi$ during one time slot in correspondence with a modulation current pulse. Therefore, by producing a modulation current pulse $\Delta I(t)$ at a time corresponding to an existence of a transmission data signal, a phase modulation between 0 and $\pi$ can be applied to an output light of the semiconductor laser. As a form of $\Delta I(t)$ which satisfies the above equation (1), a $\delta$ function (for example, $\Delta I(t) = (\pi/k)\delta(t-t_0)$) can be considered. Furthermore, any form of $\Delta I(t)$ can be used providing $\Delta I(t)$ has a narrow time region and the integral thereof is equal to $\pi/k$ or $-\pi/k$.

According to this finding the spread of oscillation wavelength is limited to sidebands resulting from a modulation and the adverse affect of chirping caused by conventional direct modulation can be avoided. Moreover, the semiconductor laser is subject to a small-amplitude modulation and the loads of both the semiconductor laser and its driving circuit can be greatly reduced. Thus, a high-speed modulation exceeding the frequency limitation of conventional direct modulation can be realized.

According to the semiconductor laser modulating method of the present invention, the light output of the semiconductor laser, which is subject to a phase modulation between 0 and $\pi$ as recited above, is introduced into a self-homodyne-type optical interferometer. Amplitude modulation is produced by a self-homodyne-type method in accordance with the respective phase differences, and the output light is converted into a light pulse of "0" or "1". Thus, high-speed light intensity modulation is made possible.

When the phase difference alternates between $\phi_1$ and $\phi_2$ as shown in FIG. 3A, for example, in an optical interferometer having an optical input signal to which a high-speed phase modulation is applied as recited above or in one having a constant input signal as shown in FIG. 2, the output light is intensity-modulated to "1" and "0", respectively. As respective probabilities of both these values are generally one half, and if it is considered that the light intensity is moved instantaneously between "1" and "0", the average intensity of the two lights becomes "½". On the other hand, if the phase difference is moved between $\phi_{1'}$ and $\phi_{2'}$ as shown in FIG. 3B, the light extinction ratio decreases, but if it is thought that the light intensity is similarly moved instantaneously between "1" and "0", the average output of the two lights also becomes "½". When the actual average intensity is considered during the switching period, either from "1" to "0" or from "0" to "1", a different average intensity can be obtained between FIG. 3A and FIG. 3B, because a limited transient period exists between the two values. Thus, although the actual average intensity during the period of $\phi_1$ and $\phi_2$ is "½", the actual average intensity during the period of $\phi_{1'}$ and $\phi_{2'}$ becomes less than "½".

Therefore, if such a change in average intensity is detected, a deviation in phase bias can be easily obtained. According to the method of stabilizing an optical interferometer of the present invention, first of all, an average intensity is obtained by integrating the intensity of the output light from an optical interferometer in a time interval corresponding to a speed which is slower than the modulation speed (for example, a time interval of 1/100 sec for a phase modulation of 1Gb/s). By performing an integration in a time interval corresponding to a speed which is slower than the modulation speed, a scattering of transmission data "1" and "0" is compensated and a fully accurate value can be obtained. By sequentially using the above average intensity, a feedback is applied to a light wavelength of input light or a difference in the two light paths, thereby correcting a phase bias upon an intensity modulation.

Deviation of a phase bias can be easily detected by a variation in average intensity as recited above and a feedback can be applied to counteract the deviation, thereby greatly stabilizing the output from the light interferometer.

The light modulation apparatus of the present invention comprises a code conversion portion, a differentiation circuit, a semiconductor laser and a light interferometer. The sign conversion portion outputs a signal with a reversed sign only when the transmission data is "1", and produces a signal with the previous sign when the transmission data is "0" (an operation opposite to the above is also accepted). The conversion output signal is differentiated by a differentiation circuit. A source of a bias current supplies to a semiconductor laser a bias current selected such that the semiconductor laser provides an output light of the desired optical intensity when the semiconductor laser is subject to an oscillation and the differentiation output signal from the differentiation circuit is overlapped or superimposed on the bias current as a modulation current pulse. The phase of the output light of the semiconductor laser is varied by the modulation current pulse. The above modulation current pulse is selected such that the phase shift or change becomes $\pi$ or $-\pi$. The optical interferometer has a construction in which a self-homodyne is possible and has a light delay circuit for providing a relative delay time corresponding to one time slot and a relative phase difference of 0 or $\pi$. Thus, when the phase of the output light of the above semiconductor laser is changed to or $\pi$ or $-\pi$, the output light of the optical interferometer becomes "0" or "1".

As described above, the semiconductor laser is put in a state of continuous oscillation and the modulation current is small compared with the constant bias current, thereby overcoming the chirping problem. The optical interferometer obtains an output light subject to an intensity modulation in accordance with a phase change in the output light of the semiconductor laser. It has a small connection loss and can operate at an extremely high speed. Therefore, a high-speed signal of several to several tens of Gb/s can be intensity-modulated in a stable manner.

FIGS. 4A and 4B show whole constructions in which the present invention is applied to an optical communication system. The optical interferometer 12 of the present invention may be provided after the semiconductor laser 11 on the transmission side and before the transmission light fiber 13 as shown in FIG. 4A. The light interferometer 12 is provided after the transmission light fiber 13 and before the receiver 14 on the receiving side. When the optical interferometer 12 is provided on the transmission side as shown in FIG. 4A, it is possible to apply a feedback to an oscillation wavelength of the semiconductor laser 11 or to apply a feedback to a difference in the optical path length of the optical interferometer 12 itself. When the optical interferometer 12 is provided on the receiver side as shown in FIG. 4B, it is possible to apply a feedback to a light-path-length difference of optical interferometer 12 itself as a means of stabilizing the optical interferometer 12. In the latter case, even when the light is reduced due to a long transmission optical fiber 13, it is still in a phase-modulation phase and the intensity is always constant, thereby facilitating so-called direct light amplification, in which a light is amplified without being converted to a current.

BRIEF DESCRIPTION OF THE DRAWINGS

FIG. 18 shows a block diagram which illustrates the principal structure of the light modulation apparatus according to the present invention, FIG. 19 shows a structure for realizing the first embodiment of the light modulation apparatus according to the present invention, FIGS. 20(a), 20(b), 20(c), 20(d), 20(e), 20(f), and (g) are graphs for illustrating the operation of the light modulation apparatus shown in FIG. 19.

DESCRIPTION OF THE PREFERRED EMBODIMENTS

The present invention is explained in more detail by referring to the attached drawings.

Figure 5:
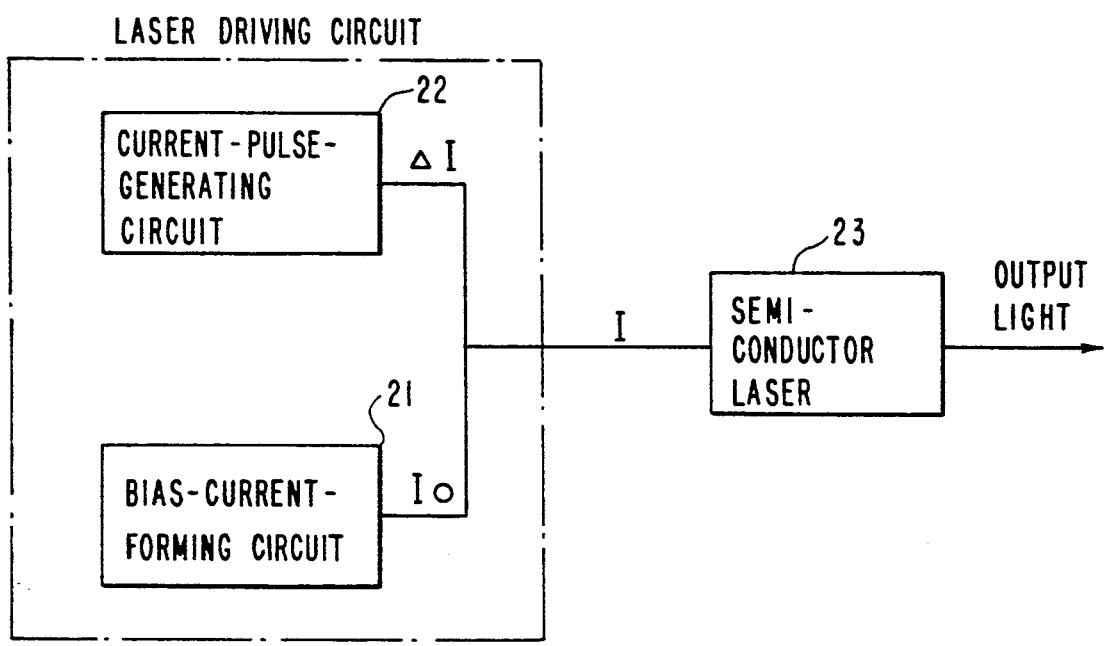
FIG. 5 shows a block diagram of a laser driving circuit used in the first embodiment of a method for modulating a semiconductor laser of the present invention.

FIG. 5 is a block diagram of a laser driving circuit according to an embodiment of a modulation method of a semiconductor laser.

In the drawing a bias current $I_O$ of a constant value (for example, 100 mA) is formed by bias-current-forming circuit 21. A current-pulse-generating circuit 22 produces a modulation current $\Delta I$ of several mA, for example, at a timing corresponding to the transmission of data. The form of $\Delta I$ is predetermined so as to satisfy $$k \int_{t_0}^{t_0 + T} \Delta I(t) dt = \pi,$$

namely, to comply with equation (1). For example it is determined to have a form that makes $\Delta I(t) = (\pi/k)\delta(t-t_0)$ or it is determined to have a form similar to it.

Figure 6:
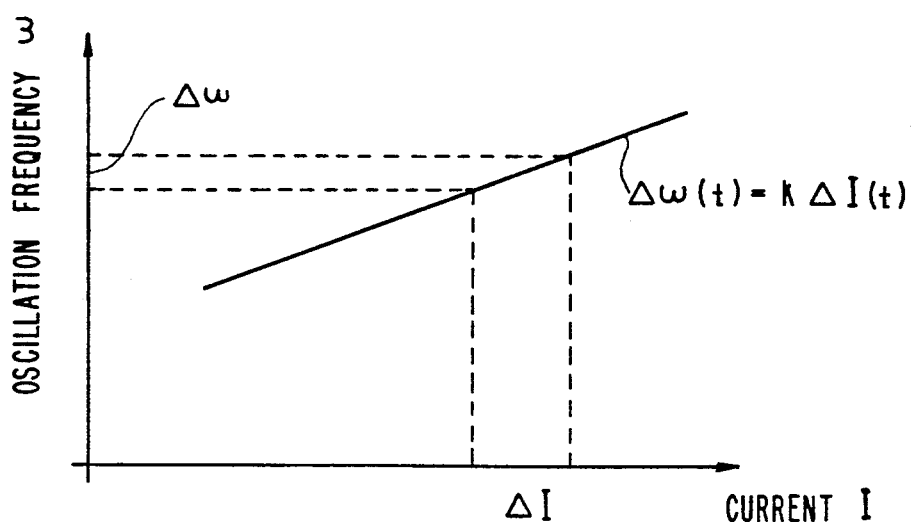
FIG. 6 shows a characteristic diagram showing the relationship between variation $\Delta I$ of the driving current and variation $\Delta \omega$ of the oscillation angular frequency in a common semiconductor laser.
Figure 7:
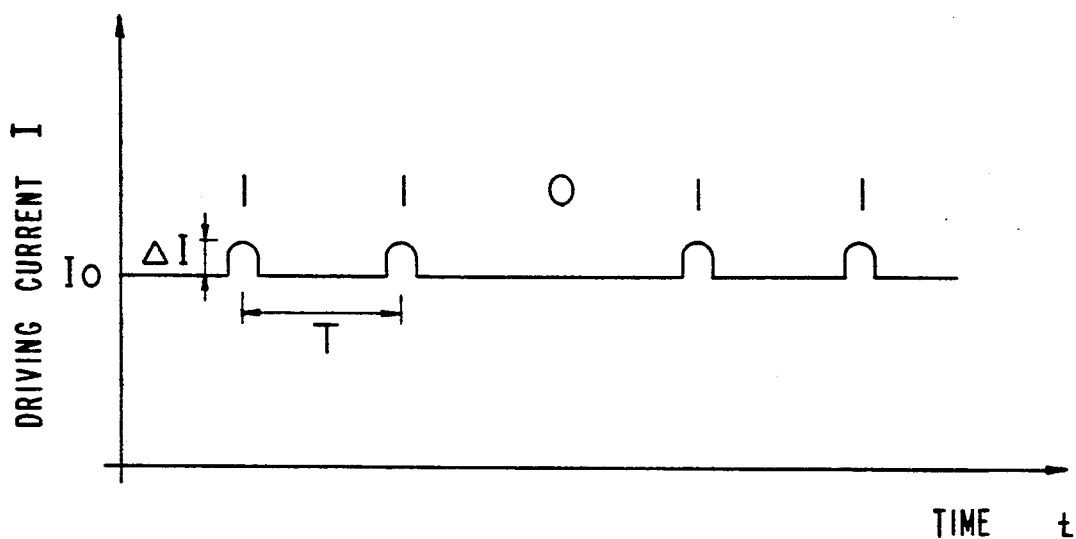
FIG. 7 shows a waveform diagram of the driving current I used in the first embodiment of a method for modulating the semiconductor laser.
Figure 8:
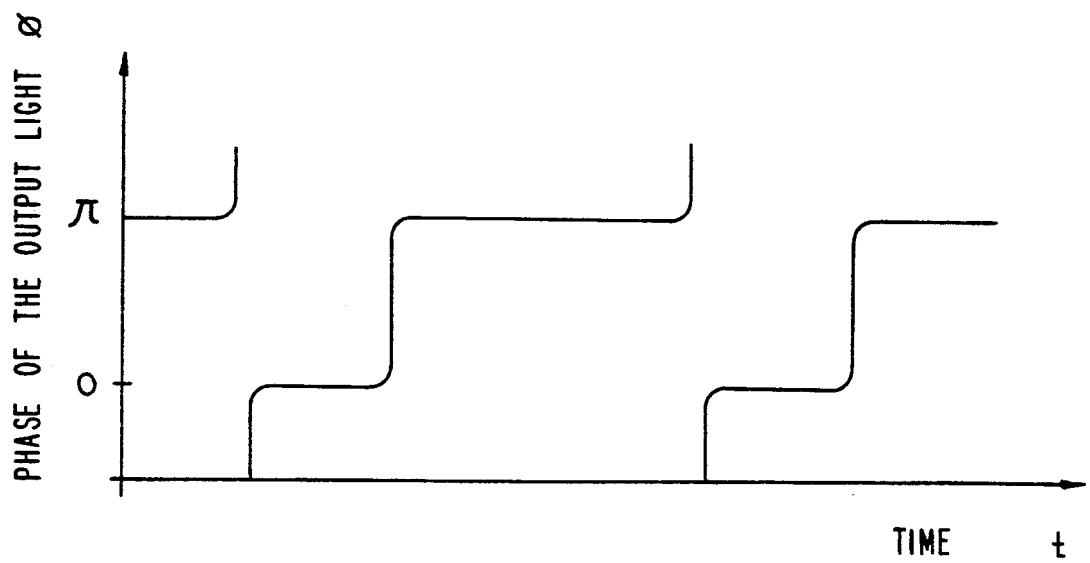
FIG. 8 shows a waveform diagram of the output light having a phase $\phi$ obtained in accordance with the driving current I shown in FIG. 7.

The modulation current $\Delta I$ obtained by the current-pulse generating circuit 22 is superimposed on the bias current $I_O$ obtained from the bias-current-forming circuit 21 and thus applied to the semiconductor laser 23 as a driving current $I(=I_O+\Delta I)$. An example of the waveform of the driving current I is shown in FIG. 7. As described above, at the time when the driving current I has instantaneous pulsed changes at various intervals, the oscillation angular frequency ω varies with the current change ΔI (as shown in FIG. 6), thereby producing a phase difference corresponding to a time integral of the change Δω. As ΔI is determined to comply with an equation of time integration of Δω, namely, $$\int_{t_0}^{t_0 + T} \Delta\omega(t)dt = k \int_{t_0}^{t_0 + T} \Delta I(t)dt = \pi$$

in the present embodiment as stated above, a relative phase difference of π can be produced before and after ΔI is applied. A variation of the phase φ of the output light is shown in FIG. 8 in accordance with the waveform of the driving current of FIG. 7, with the same time position plotted on an abscissa having the same time scale as in FIG. 7. Namely, the phase φ of the output light is inverted by π at a certain portion of the current variation ΔI, thereby showing that a phase modulation is enabled between 0 and π.

In the present embodiment, by applying a small current variation ΔI to a constant bias current $I_O$ the phase difference of π can be applied to the output light. As the amplitude of the modulation current can be made extremely small, as described above, the load imposed on both the semiconductor laser and the driving circuit is extremely small. Moreover, spreading of the oscillation wavelength is limited to sidebands caused by the modulation. It is suppressed to the same degree as when using an external modulator, thereby preventing the adverse effect of chirping. Thus, the present invention solves the big problem of limited high-speed operation with direct modulation, enabling high-speed modulation (for example, of several to several tens of Gb/s) which greatly exceeds the frequency limitation occurring with a direct modulation.

Next, a second embodiment of the method for modulating a semiconductor laser according to the present invention is described.

Figure 9:
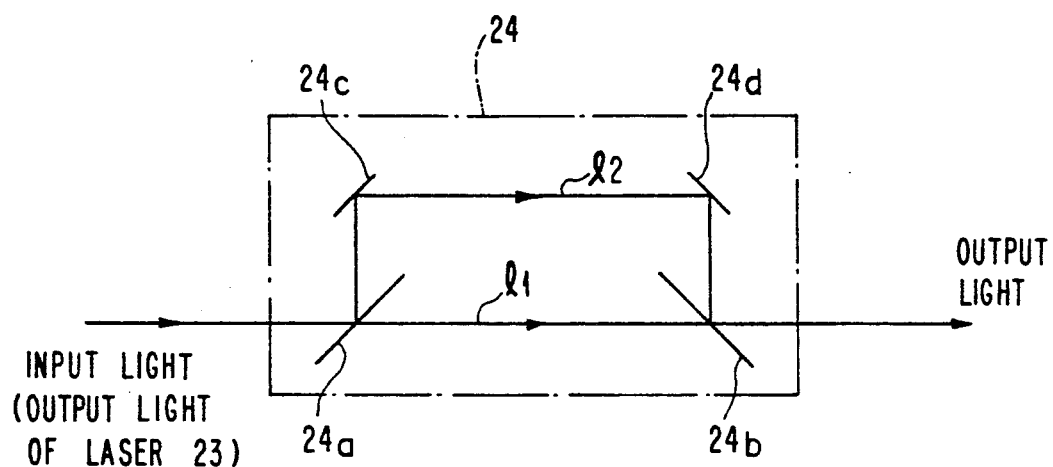
FIG. 9 shows a structural view of an optical interferometer used in the second embodiment of a method for modulating the semiconductor laser according to the present invention.

In this embodiment, the output light (phase-modulated light) of the semiconductor laser 23 obtained in the above embodiment is input to a self-homodyne-type optical interferometer as shown in FIG. 9. The optical interferometer 24 is constructed such that a light beam is divided or two light beams are combined by two half-mirrors 24a and 24b. A time delay is applied to light passing through one light path $l_2$ via reflection at mirrors 24c and 24d, with respect to light passing through the other light path $l_1$. This time delay is equal to a single time band T (one time slot) of the driving current I as shown in FIG. 7.

Figure 10:
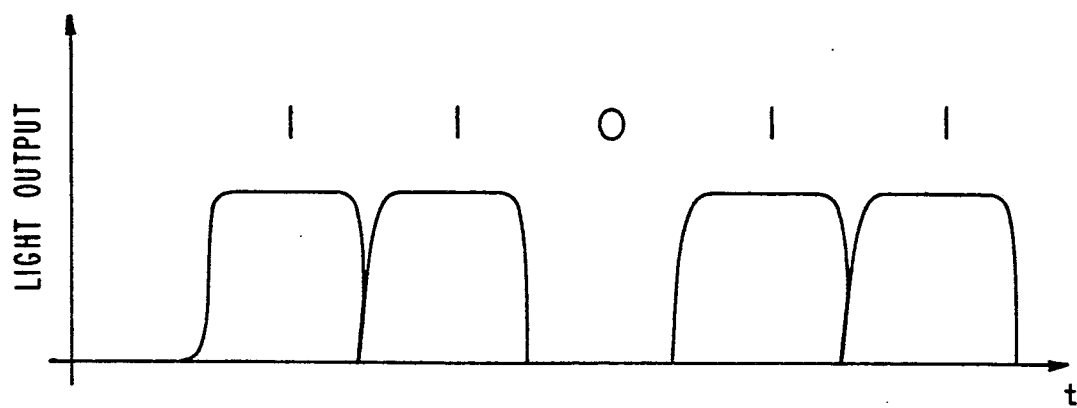
FIG. 10 shows a waveform diagram of the light output obtained in accordance with the phase $\phi$ of the output light of FIG. 8 from the optical interferometer shown in FIG. 9.

Therefore, the output light from the optical interferometer 24 combines light of a certain time period obtained by the semiconductor laser 23 and light of a time period earlier or later by one unit, thereby providing a light pulse of "0" or "1" in accordance with a phase difference of π or 0 of the two combined lights. Namely, an output light (phase-modulated light) of the semiconductor laser 23 is intensity-modulated by a self-homodyne-type optical interferometer 24. For example, the variation in intensity of the output lights from the optical interferometer 24 obtained in accordance with the phase variation of FIG. 8, is shown in FIG. 10. As is clear from the drawing, when the phase difference between two lights to be combined is 0 they are added, but when the phase difference is π, they cancel each other out. Thus, a light output of "1" or "0" is obtained, in accordance with the non-existence or existence of the modulating current ΔI of FIG. 7.

According to this embodiment, by applying a small current variation ΔI to the driving current in a similar manner to the first embodiment, the intensity modulation of "0" and "1" can be applied to the output light from the semiconductor laser. Accordingly, in a similar manner to the first embodiment, the adverse effect of chirping is eliminated and load on the semiconductor laser and driving circuit is reduced, thereby realizing high-speed operation using direct modulation.

Figure 11:
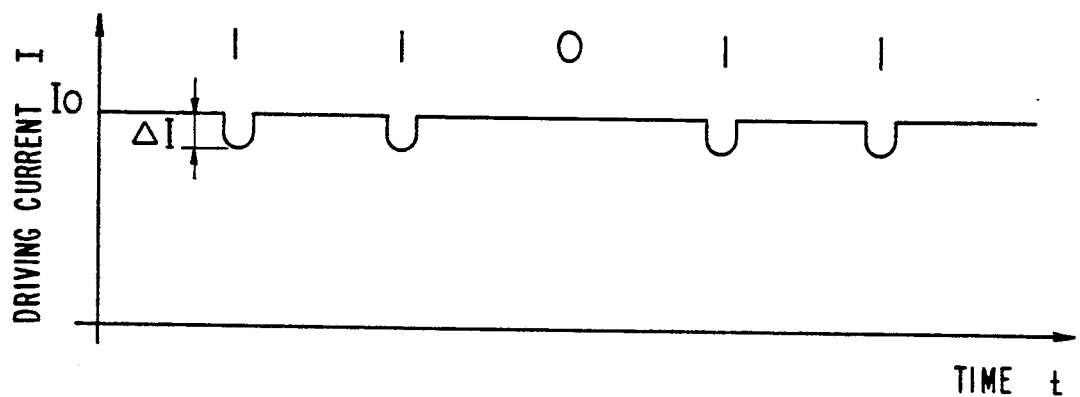
FIG. 11 shows a waveform diagram of the driving current I used in the third embodiment of a method for modulating the semiconductor laser according to the present invention, FIGS. 12A and 12B respectively represent other examples of a self-homodyne optical interferometer.

The modulating current ΔI shown in FIG. 7 produces a phase difference of π but, as it may have a phase difference of −π, it may be modulated as shown in FIG. 11 such that ΔI is subtracted from $I_O$. In this case, an intensity modulation similar to FIG. 10 can also be obtained if the output light from the laser is transmitted through the optical interferometer 24 of FIG. 9.

The form of the modulation current ΔI need not be of δ function or similar, but may be any type of function in which the integral becomes π/k in a narrow region in terms of time.

Figure 12A:
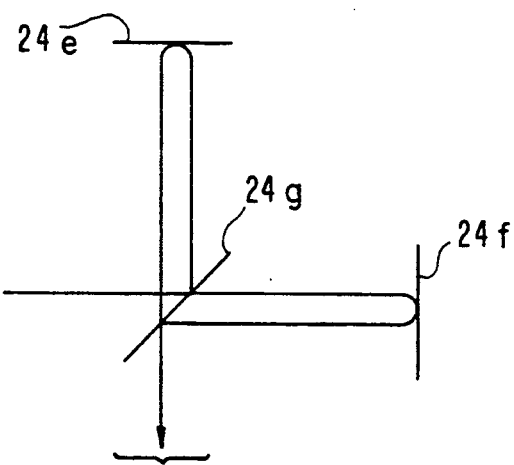
Figure 12B:
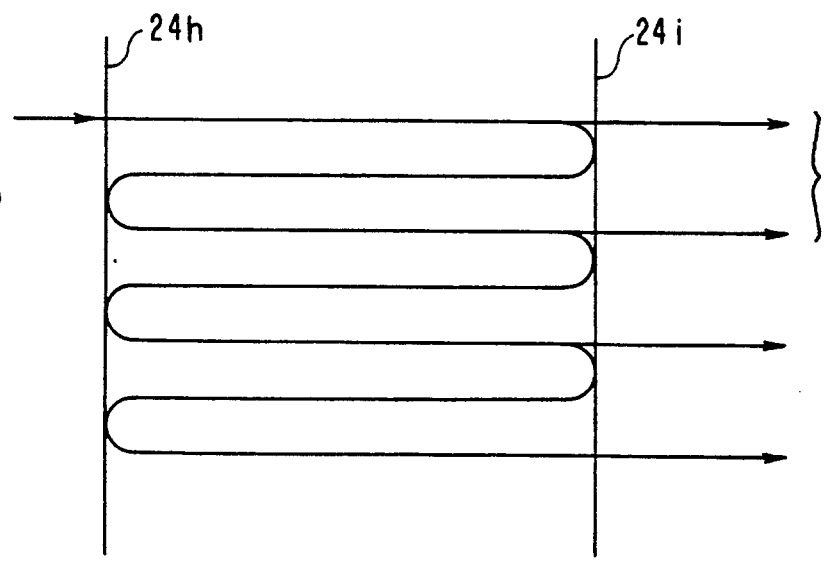

In addition to the optical interferometer of the Mach-Zehnder type as described above, an interferometer of the Michelson type, shown in FIG. 12A, and one of the Fabry-Perot type, shown in FIG. 12B, can be used as optical interferometer 24, providing it can perform an optical interference of the self homodyne-type. In the drawing, 24e, 24f, and 24h represent mirrors, and 24g and 24i represent half mirrors.

Figure 13:
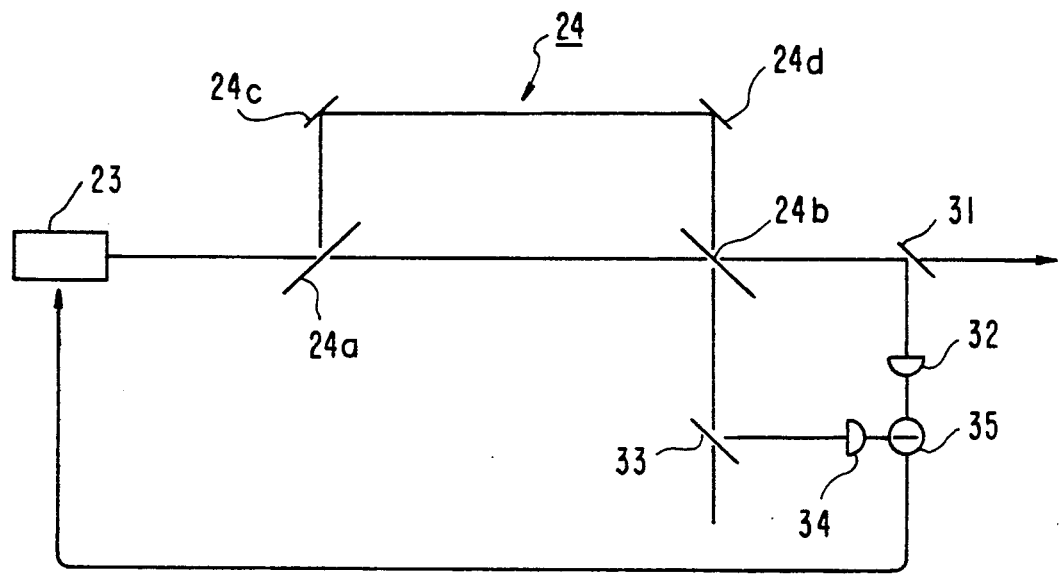
FIG. 13 shows a schematic view of a structure for realizing the first embodiment of the method for stabilizing the optical interferometer according to the present invention.

FIG. 13 shows a structure for realizing the first embodiment used as a method for stabilizing an optical interferometer according to the present invention, and the present embodiment is applied to the optical interferometer 24 shown in FIG. 9.

An output light obtained by combining input lights at half mirror 24b as recited with reference to FIG. 9 can be detected by a photo detector 32 through a half mirror 31 as shown in FIG. 13. The other light transmitted in a different direction from the above light output through half mirror 24b and having an intensity opposite to the above output light, is detected by the other photo detector 34 through half mirror 33. These two photo detectors 32 and 34 have relatively large time constants compared with the time interval used for phase modulation by semiconductor laser 23, and are constructed such that a large capacity is connected in parallel to an ordinary photodiode. By detecting output light at such photodetectors 32 and 34, an average intensity can be obtained by integrating the output light intensity in a time interval corresponding to a speed which is slower than that of the phase modulation (for example, about 1/100 sec with regard to a phase modulation of 1Gb/s). As described above, such variation of average intensity corresponds to the deviation of phase bias upon an intensity modulation.

Figure 3:
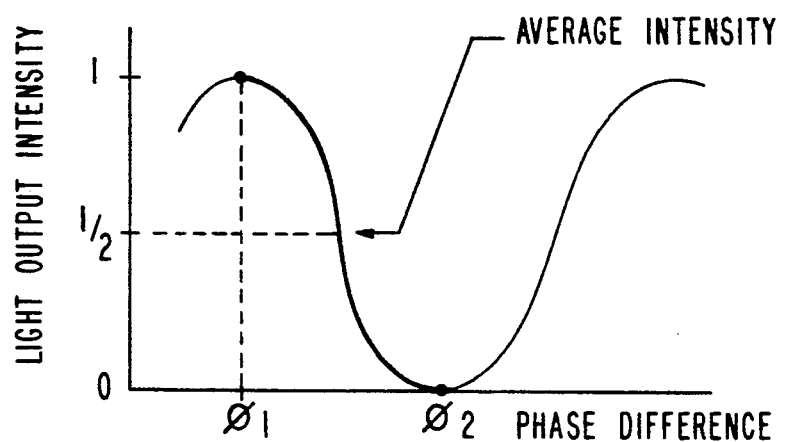
FIGS. 3A and 3B show the ideal relationship and a deviated relationship between the phase difference and the output light intensity in an intensity modulation in the optical interferometer.
Figure 3:
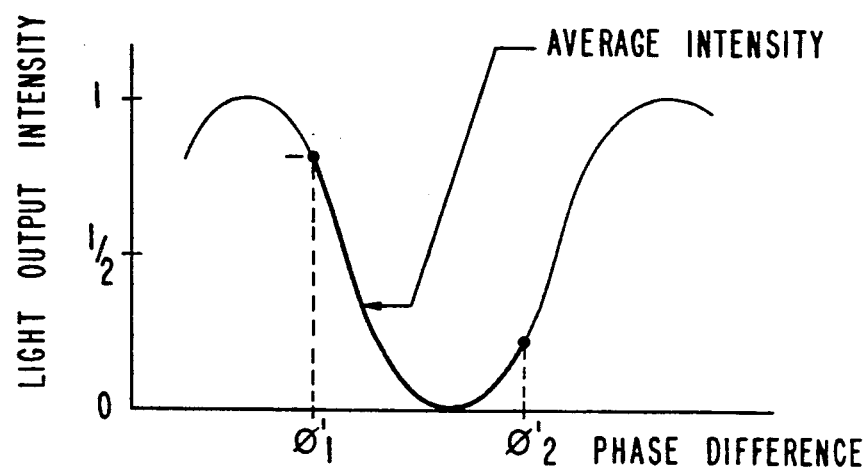

The intensity of respective lights detected by the photodetectors 32 and 34 are reversed. Thus, by obtaining the difference in output from the two photodetectors 32 and 34 with a differential amplifier 35, the amount by which the average intensity has deviated from "½" can be obtained. When the output of the differential amplifier 35 is 0, the average intensity is "½", thus indicating (as shown in FIG. 3A) that deviation of the phase bias does not occur. On the other hand, when the output from the differential amplifier 35 deviates to the positive or negative side, the average intensity is not "¼", thus indicating that the phase bias is shifted (as shown in FIG. 3B). By using the output value from the differential amplifier 32 corresponding to a shift in phase bias, a feedback is applied to the oscillation wavelength of semiconductor laser 23. Namely, by superimposing the output from differential amplifier 35 onto bias current I of semiconductor laser 32 (as shown in FIG. 5) the oscillation wavelength of the semiconductor laser 23 is changed. As described above, if the oscillation wavelength of semiconductor laser 23 varies, the phase difference between the two lights to be combined at half mirror 24b varies, thereby changing the phase bias at the time of the intensity modulation and changing the average intensity of the output light accordingly. Therefore, if a feedback is always applied so that the output of the differential amplifier 35 is made 0, the phase bias can be maintained at "¼", thereby achieving a stabilized light output. Furthermore as the intensity of respective output lights detected by photo detectors 32 and 34 are reversed, the shift of the phase bias doubles, in the difference in respective light outputs, resulting in a large phase shift, thereby enabling extremely accurate detection of the deviation of respective light outputs.

Figure 14:
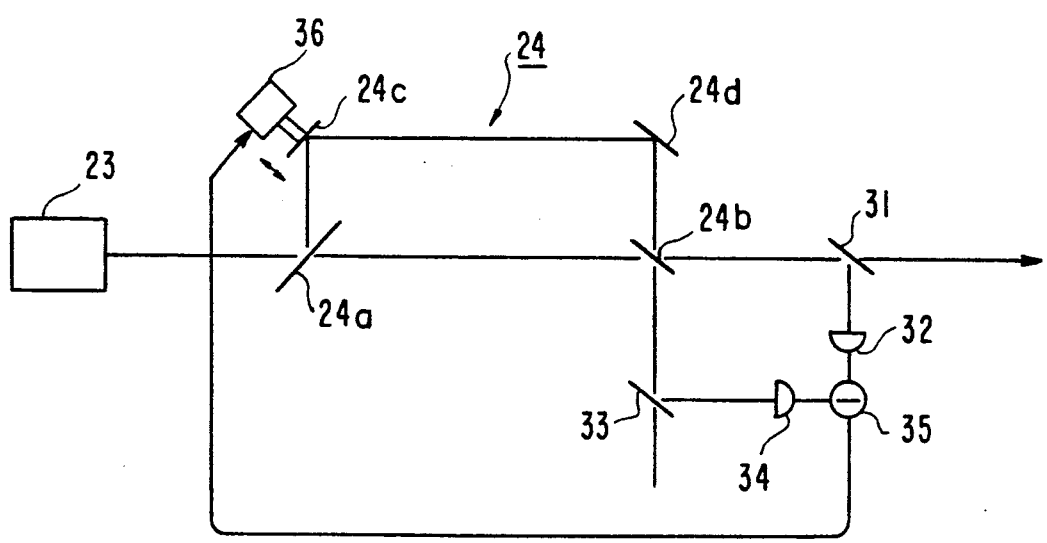
FIG. 14 shows a schematic view of a structure for realizing the second embodiment of a method for stabilizing the optical interferometer according to the present invention.

FIG. 14 shows a structure for realizing the second embodiment of a method for stabilizing an optical interferometer according to the present invention.

In this embodiment, instead of applying a feedback to the oscillation wavelength of semiconductor laser 23, a feedback is applied to a difference in light path to achieve stabilization of the interferometer. Namely, in FIG. 14, a mirror 24c of an optical interferometer 24 is secured to a piezo element 36. This element is driven in accordance with the output of differential amplifier 35 and mirror 24c is moved in the direction shown by the arrow, thereby changing the actual length of the light path from half mirror 24a to half mirror 24b through mirrors 24c and 24d.

By changing the difference in a light path length as recited above, the phase difference of two lights to be combined by half mirror 24b can be changed. Thus, by continually applying a feedback so that the output from the differential amplifier 35 is maintained at 0 the phase bias can be maintained in an ideal condition in a similar manner to the above embodiment, thereby achieving a stabilized output.

Figure 15:
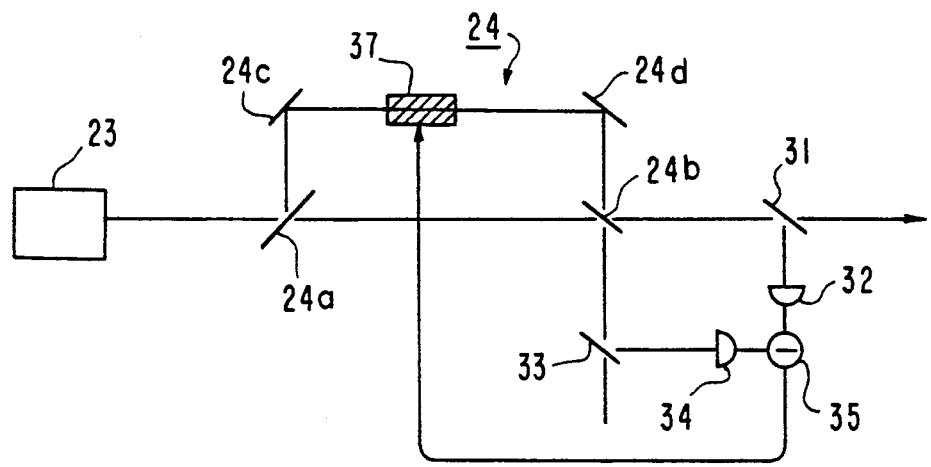
FIG. 15 shows a schematic view of a structure for realizing the third embodiment of a method for stabilizing the optical interferometer in accordance with the present invention.

FIG. 15 shows a structure for realizing the third embodiment of a method for stabilizing an optical interferometer in accordance with the present invention.

According to the embodiment, in order to vary the difference in light path length in a similar manner to the second embodiment, a heater 37 is provided on a light path between mirrors 24c and 24d in place of a piezo element 36 and the heater 37 is driven in accordance with the output of differential amplifier 35. When the temperature is varied by employing a heater 37, a refractive index of the pertinent portion of the light path is changed, thereby varying the length of the light path accordingly. By applying a feedback to a difference in light path length as described above, a stabilized output of the optical interferometer 24 can also be achieved in a similar manner to the above embodiment.

Figure 2:
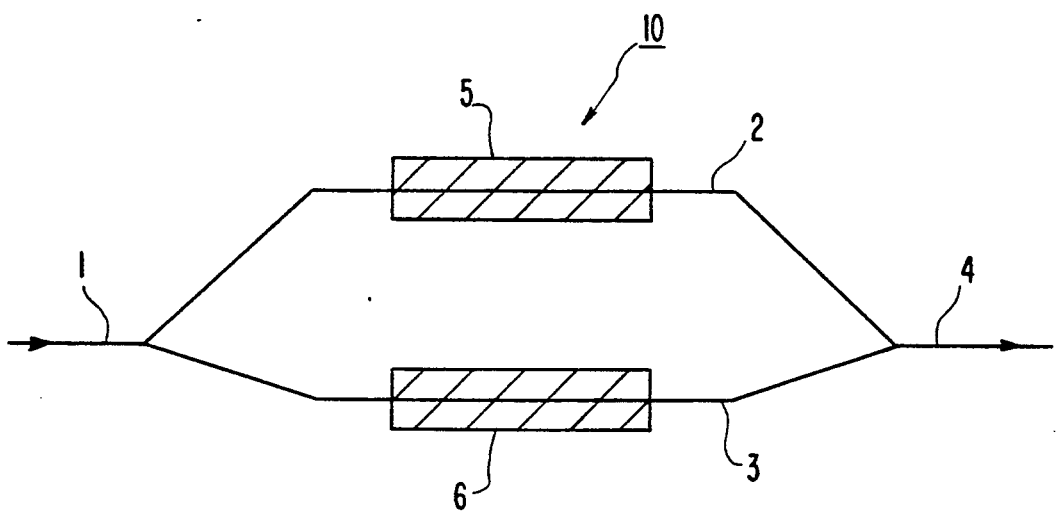
FIG. 2 shows a schematic view of an electro-optical modulator of the Mach-Zehnder type, which is generally available.
Figure 16:
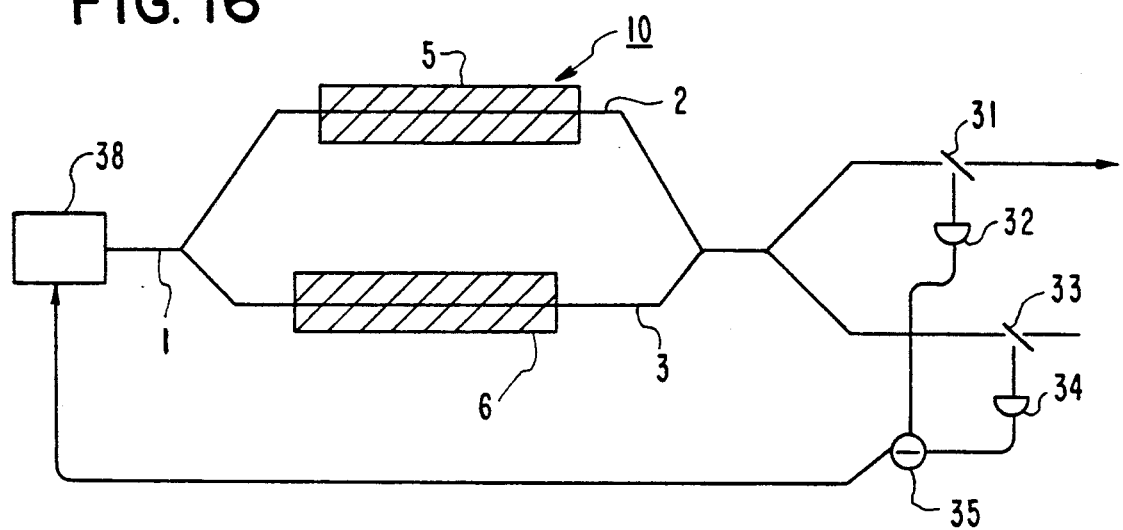
FIG. 16 shows a schematic view of a structure for realizing the fourth embodiment of a method for stabilizing the optical interferometer according to the present invention.

FIG. 16 shows a structure for realizing the fourth embodiment of the present invention, that is, a method of stabilizing an optical interferometer, and this embodiment is applied to an optical interferometer 10, as shown in FIG. 2

In the embodiment, two output lights having reversed light intensity are detected by photodetectors 32 and 34 through half mirrors 31 and 33 in a similar manner to the embodiment shown in FIG. 13. The differential amplifier 35 detects the difference in output from the photo detectors and, based on this difference, applies a feedback to an oscillation wavelength of semiconductor laser 38 which produces a constant light output. As light path lengths of optical waveguides 2 and 3 are different, and the phase difference of the light passing through the optical waveguides 2 and 3 vary with the oscillation wavelength, thereby enabling the average intensity of output light of the optical interferometer 10 to vary accordingly. Therefore, if the feedback is always applied so that the output of differential amplifier 35 is maintained at 0, the output from optical interferometer 10 can be stabilized in a similar manner to the above embodiment.

Figure 17:
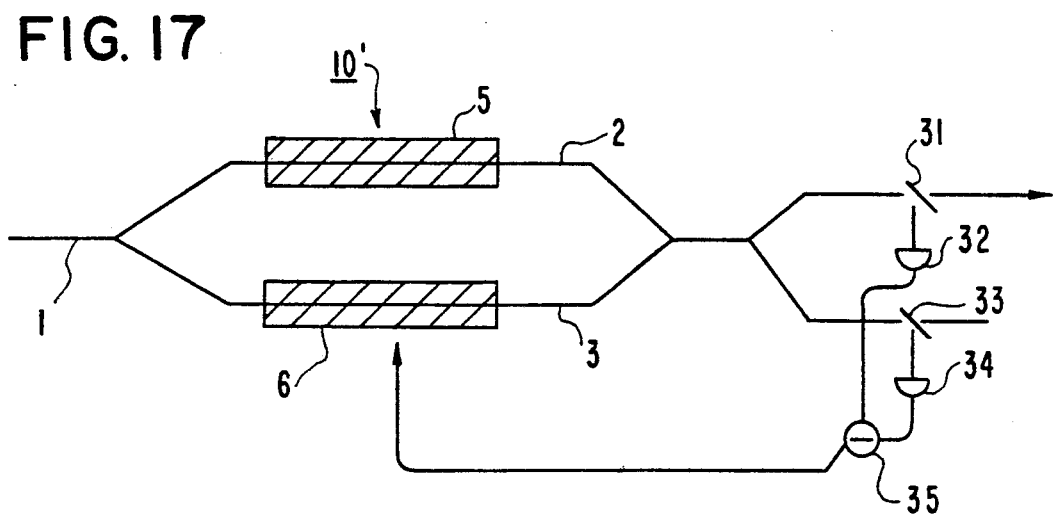
FIG. 17 shows a structure for realizing the fifth embodiment of a method for stabilizing the light interferometer according to the present invention.

FIG. 17 shows a structure for realizing the fifth embodiment of a method for stabilizing an optical interferometer of the present invention. This is an example of an application to an optical interferometer 10' in which two optical waveguides 2 and 3 in the optical interferometer 10 shown in FIG. 2 are made with the same length.

In this embodiment, a feedback is applied to the difference in optical waveguides 2 and 3, thereby changing the phase difference of the two lights output from the waveguides. In the structure shown in FIG. 17, the voltage applied to the electrode 6 varies in accordance with the output of the differential amplifier 35, thereby changing the length of the light path of the optical waveguide 3 using a variation in refractive index in accordance with the voltage applied to the electrode 6. According to the present embodiment, the phase bias can be maintained in an ideal state like the respective embodiments explained hereinbefore, thereby achieving a stabilized output from optical interferometer 10'.

In the above embodiments, the photo-detectors 32 and 34 and the differential amplifier 35 are used as a means for detecting the average intensity of the light output from the optical interferometers 24, 10, or 10'. The average intensity detecting means is not limited to this type, and any structure may be used, providing that an average intensity can be detected by integrating the intensity of the output light from an optical interferometer in a time interval corresponding to a speed which is slower than that of a phase modulation.

The method of stabilizing an optical interferometer of the present invention can, of course, be applied to various optical interferometers, such as the Michelson or Fabry-Perot types, as well as the Mach-Zehnder type shown in FIGS. 2 and 9.

Figure 4A:
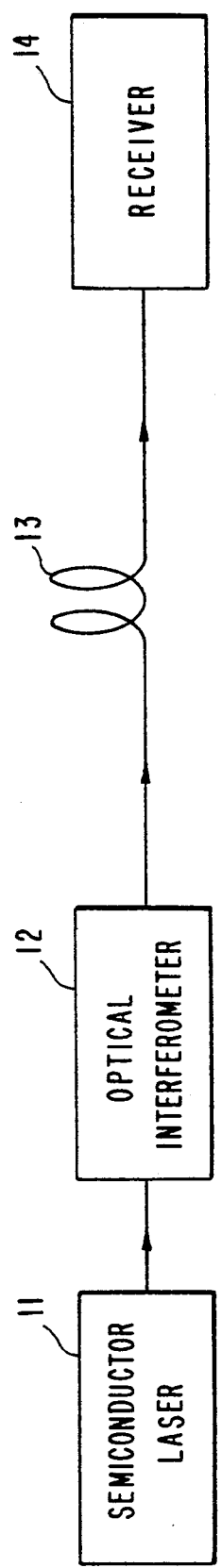
FIGS. 4A and 4B show block diagrams of whole structures in which the present invention is applied to optical transmission systems.
Figure 4B:
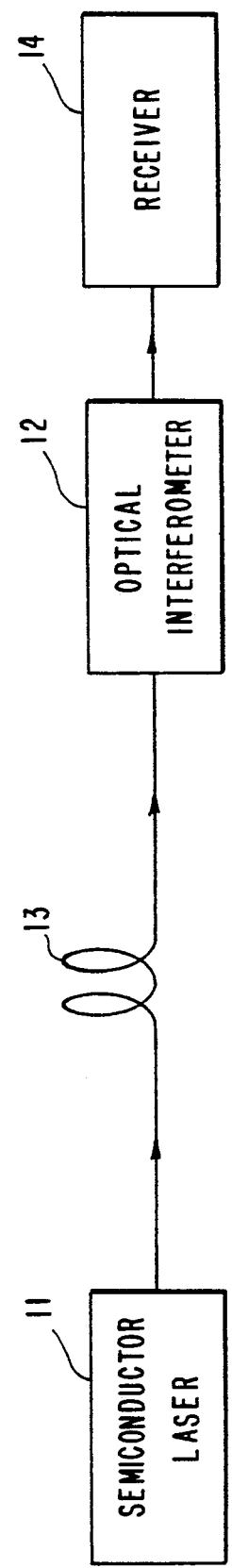

When the present invention is applied to an optical transmission system, as recited hereinbefore, two kinds of dispositions are considered (or possible) as shown in FIGS. 4A and 4B. Any structure in which a feedback is applied to a difference in length of optical light paths is suitable for both the dispositions shown in FIGS. 4A and 4B, and any structure in which a feedback is applied to the oscillation wavelength as shown in FIGS. 13 and 16, is suitable for the disposition shown in FIG. 4A. When a feedback is applied to an oscillation wavelength in a disposition such as that shown in FIG. 4A, the disposition is advantageous in that the response time is fast. On the other hand, when a feedback is applied to a difference in length of a light path in a disposition such as that shown in FIG. 4B, a direct light amplification is facilitated even when the light intensity is reduced on the way of transmission.

FIG. 18 is a block diagram of the light modulation apparatus of the present invention and FIG. 19 shows a structure of the first embodiment thereof.

As shown in FIG. 19, the light modulator of the present embodiment comprises an AND circuit 50, a flip-flop 51, a condenser 52, a semiconductor laser 53, an optical isolator 54, a bias current source 55, an inductor 56, a resistor 57, an optical interferometer 58 (half mirrors 58a and 58b, and mirrors 58c and 58d), half mirrors 59, 60 and 61, photodetectors 62 and 63, a subtraction processing circuit 64 and a mirror driving portion 65.

Comparing the structure of the present embodiment with that of FIG. 18, the circuit comprising the AND circuit 50 and the flip-flop 51 corresponds to the sign conversion portion 40, and the circuit comprising the condenser 52 and the resistor 57 corresponds to the differentiation circuit 41. Further, the semiconductor laser 53, the optical interferometer 58 and the bias current source 55 correspond to the semiconductor laser 42, the optical interferometer 43 and the bias current source 44, respectively.

In the light modulation apparatus described above, transmission data comprising "1" and "0" is applied to the clock terminal CK of flip-flop 51. Upon receiving transmission data "1", "1" and "0", data appearing at the output terminal Q are reversed, and upon receiving transmission data "0", data appearing at output terminal Q remain unchanged. Therefore, a sign conversion is conducted so that the sign of the transmission data is converted, only when transmission data is "1", thereby enabling AND circuit 50 to produce an output in accordance with the transmission clock signal. The AND circuit 50 is provided to make the conversion output signal an RZ signal.

Figure 1:
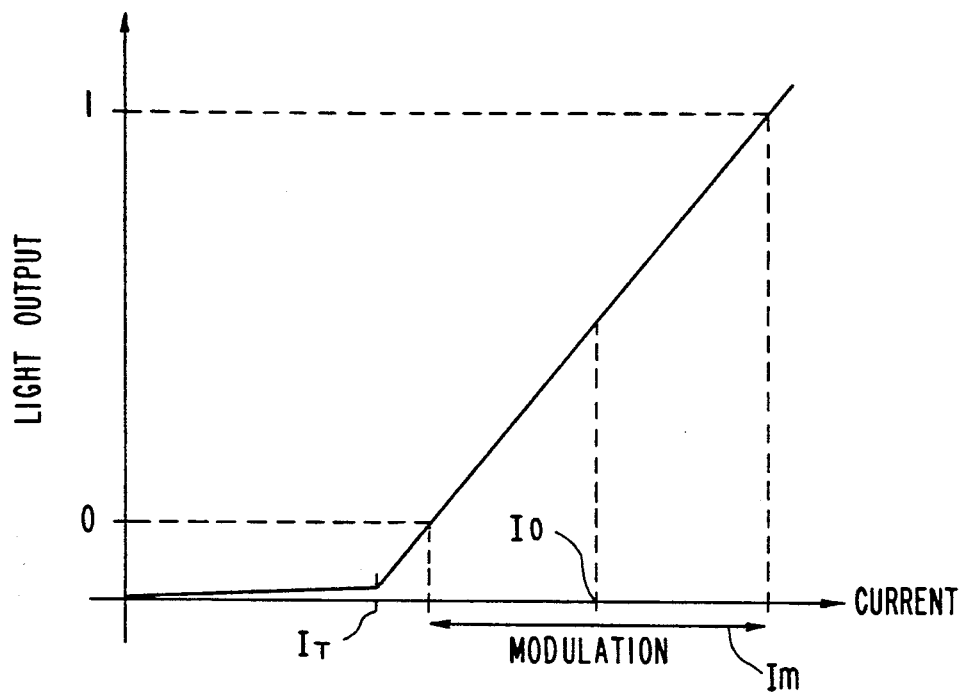
FIG. 1 shows a drawing for explaining the operation of conventional direct modulation.

This conversion output signal is supplied to semiconductor 53 as conversion current pulse ΔI through condenser 52 and is superimposed on a constant bias current $I_O$ supplied from bias current source 55. This constant bias current $I_O$ is determined to be a value such that semiconductor laser 53 performs a continuous laser oscillation to provide an output light of a desired intensity, as shown in FIG. 1.

The output light from the semiconductor laser 53 is input to the optical interferometer 58 through a light isolator 54. The basic structure of the optical interferometer 58 is the same as that of the optical interferometer 24, shown, for example, in FIG. 9. A light is divided into two light signals, one of which propagates along a path including half mirrors 59 and 58b, and the other of which propagates along a path (a light delay circuit) including mirrors 58c and 58b and half mirrors 60 and 58b. A relative delay time is set equal to one time slot and a relative phase difference is set equal to 0 or π, and the optical interference of a self homodyne type is conducted. An optical fiber may be used for the light delay circuit instead of using mirrors 58c and 58b.

Half mirrors 59, 60 and 61, photo detectors 62 and 63, a subtraction processing circuit 64 and a mirror driving portion 65 constitute one example of a structure for stabilizing an output from the optical interferometer 58 in a similar manner to the structure shown in FIG. 14. A differential amplifier, for example, can be used for subtraction processing circuit 64, and a piezo element, for example, can be used for mirror driving portion 65.

In this embodiment, a product of a time integration of a modulation current pulse ΔI(t) applied to semiconductor laser 53 in a time interval corresponding to a time slot and chirping coefficient k is selected to be π or −π to satisfy the equation (1) in a similar manner to a modulation method for a semiconductor laser as shown in FIG. 5. Thus, a differentiation circuit comprising condenser 52, semiconductor laser 53 and resistor 57 is determined to provide a modulation current pulse ΔI(t) which satisfies the above-recited relationship and the output light from semiconductor laser 53 is modulated such that the phase φ becomes π or −π.

As described above, the relative delay time between one divided light signal and the other is set at one time slot and the relative phase difference at 0 or π in the optical interferometer 58. Therefore, when the relative phase difference is set at π and the phase φ of the output light from the semiconductor laser 53 continues to be of the same value, the phase difference of the light signal applied to the half mirror 58b becomes π, thereby enabling the intensity of modulated output light to be "0". On the other hand, when the phase φ of the output light from the semiconductor laser 53 is changed to π, the phase difference of the light signal applied to the half mirror 58b becomes 2π for a period of one time slot, thereby enabling the relative value of the intensity of the modulation output light to become "1". A light intensity modulation can be conducted by superimposing a modulation current pulse ΔI(t) on a constant bias current $I_O$ to drive semiconductor laser 53. This enables a phase φ of the output light from semiconductor laser 53 to change to π or −π. The output light is thus applied to optical interferometer 58, thereby providing the light intensity modulation.

When the relative phase difference in the optical interferometer 58 is set at 0 and the phase φ of the output light from the semiconductor laser 53 is changed to π, the phase difference becomes π for a period of one time slot and the intensity of the modulated output light becomes "0", and the relative value of the intensity of the modulated output light for the other time slot becomes "1".

The operation of the present embodiment is explained in detail, by referring to FIGS. 20(a) to 20(g).

The sign of the transmission data comprising "1" and "0" as shown in FIG. 20(a), for example, is converted as shown in FIG. 20(b) by the flip-flop 51. Namely, the sign of the conversion output signal is reversed every time the transmission data becomes "1" and transmission data of "01101001" becomes a conversion output signal of "01001110". When this conversion output signal is used for a modulating current pulse ΔI applied to the semiconductor laser 53, the modulating current pulse ΔI is given the waveform shown in FIG. 20(c). For a pulse waveform of isolated "1", the oscillation angular frequency ω of semiconductor laser 53 is changed such that its phase φ becomes π as recited above. For a pulse waveform of a continuous "1", the average driving current increases, thereby failing to provide the desired change of the phase φ. Therefore, in the present invention, differential circuit 41 (comprising condenser 52, and resister 57) differentiates the conversion output signal to provide a modulating current pulse as shown 10 in FIG. 20(d).

Therefore, the semiconductor laser 53 has the oscillation angular frequency ω in accordance with the above modulating current pulse. The output light phase φ from the semiconductor laser 53 corresponds to a time integration of an oscillation angular frequency ω as recited above, and has the waveform shown in FIG. 20(e). When the conversion output signal has a continuous "1", the semiconductor laser 53 can be driven to produce a change of $\pi$ in the output light phase $\phi$.

Further by enabling a light signal having this phase to pass through the interferometer 58, a light signal having the phase shown in FIG. 20(e) by a solid line, and a delayed light signal having a phase which is delayed by one time slot period T from the above light signal, as shown by a dotted line, are incident to the half-mirror 58b. Therefore, the phase difference of the light signal which is incident to the half mirror 58, as shown in FIG. 20(f), is $\pi$ when the conversion output signal is "0", and $2\pi$ (or 0) when it is "1". The light signals of the phase difference $2\pi$ (or 0) interfere with each other at the half mirror 58b, thereby providing an output light which is intensity-modulated in accordance with the transmission data, as shown in FIG. 20(g).

In the present embodiment, the bias current $I_O$ supplied to the semiconductor laser 53 from bias current source 55 is determined in accordance with a characteristic of semiconductor laser 53. The bias current $I_O$ may be, for example, 60 mA and the superimposed modulation current pulse $\Delta I$ supplied from the differential circuit may be, for example, 11 mA. Accordingly, as the modulating current pulse is small compared with the bias current, chirping does not occur, unlike in the prior art. The optical interferometer 58 provides a light delay before recombination of one time slot and determines the relative phase difference to be 0 or $\pi$. Thus, the loss in connection is small, and an extremely efficient intensity-modulation can be realized.

Feedback is applied to the difference in light path length of the optical interferometer 58 using half mirrors 59, 60 and 61, photo detectors 62 and 63, subtraction processing circuit 64 and mirror driving portion 65. Thus by moving the mirror 58c with the mirror driving portion 65, the output from subtraction processing circuit 64 is made 0. Thus stabilization of the output from optical interferometer 58 can be achieved in a similar manner to that shown in FIG. 14.

Figure 21:
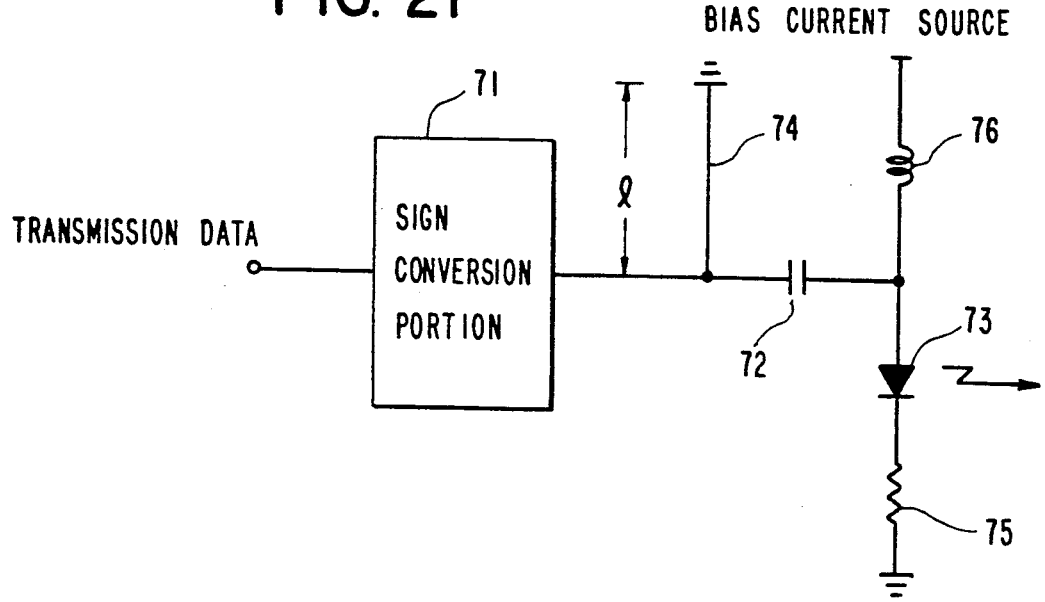
FIG. 21 is a circuit diagram of a differentiation circuit used for the second embodiment of the light modulation apparatus.

FIG. 21 shows the circuit diagram of a differential circuit relating to the second embodiment of the light modulation apparatus of the present invention.

The circuit in FIG. 21 comprises a sign conversion portion 71, a condenser 72, a semiconductor laser 73, a stub 74, a resistor 75 and an inductor 76. The sign conversion portion 71 converts the sign of the transmission data in a similar manner to that of the above embodiment, thereby producing a conversion output signal having a pulse width of $\frac{1}{2}$ a time slot. The length l of the stub 74 is selected such that it reflects transmission data by reversing the polarity of the applied conversion output signal, thereby enabling the reversed conversion output signal to be supplied to the condenser 72 after $\frac{1}{2}$ a time slot. Thus, the modulating current pulse supplied to the semiconductor laser 73 through the condenser 72 is formed with a waveform similar to that of FIG. 20(d) and the modulation current pulse is superimposed on the constant bias current supplied from the bias current source to be applied to the semiconductor laser 73. Therefore, the semiconductor laser 73 provides output light having a phase $\phi$ as shown in FIG. 20(e).

Figure 22:
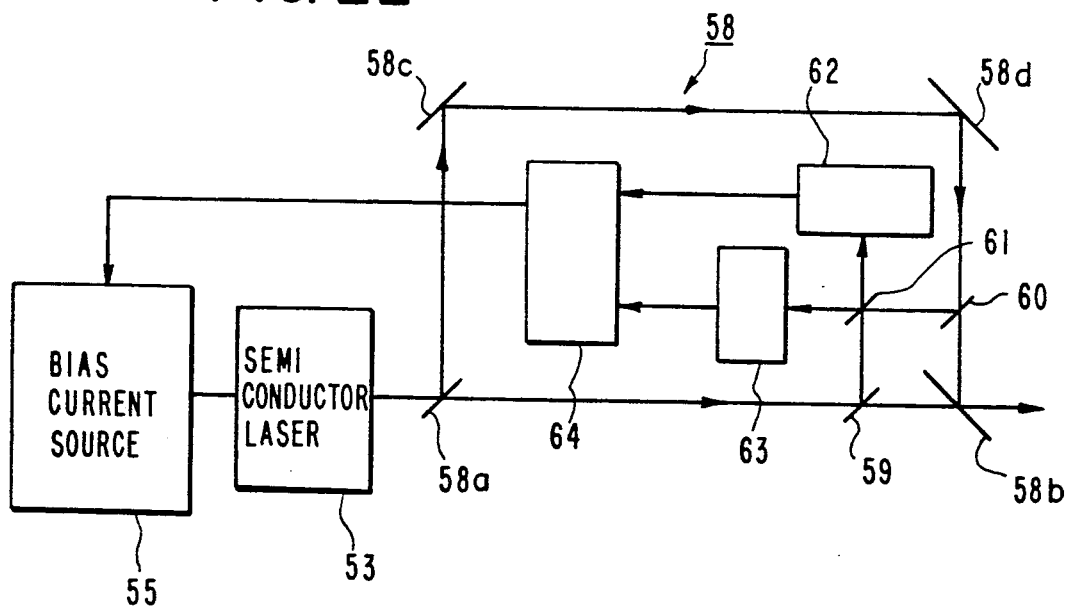
FIG. 22 shows the structure of a means for stabilizing the optical interferometer used in the third embodiment of the light modulation apparatus according to the present invention.

FIG. 22 is the third embodiment of a means for stabilizing the light modulator of the light modulation apparatus of the present invention. A feedback is applied to an oscillation wavelength of the semiconductor laser 53 by adding the output signal from the subtraction processing circuit 64 to the bias current source 55 in a similar manner to the stabilizing method shown in FIG. 13, thereby maintaining the output signal of the subtraction processing circuit 64 at 0. Thus, the phase bias upon intensity modulating the output from the optical interferometer 58 is maintained in an ideal state (as shown in FIG. 3A), thereby stabilizing the output of the light interferometer 58.

The above-recited light interferometer 58 is of the Mach-Zehnder-type and may be constructed of an optical waveguide. In place of the Mach-Zehnder-type light interferometer, one of the Michelson type or Fabry-Perot type may be used.

In respective circuits for stabilizing the optical interferometer as shown in FIGS. 19 and 22 the appearance probability of "1" and "0" for the transmission data is set at $\frac{1}{2}$. If the appearance probability is set at a value other than $\frac{1}{2}$, the subtraction processing circuit 64 processes the transmission data in accordance with this appearance probability so that a feedback can be applied to enable the difference between the detection signals from photo detectors 62 and 63 to have a predetermined value.

POSSIBILITY OF APPLYING THE PRESENT INVENTION TO INDUSTRY

As explained above, the method of modulating the semiconductor laser, the method of stabilizing the optical interferometer and the light modulation apparatus are useful for light transmission systems shown in FIGS. 4A and 4B and, may also be applied to various kinds of optical devices as a matter of course.

What is claimed is:

1. A semiconductor laser apparatus for driving a semiconductor laser, comprising:

modulating current generating means for phase modulating an output light of the semiconductor laser by generating a modulating current pulse such that an integral of an oscillation frequency becomes $\pi$ or $-\pi$ in terms of a phase amount, said modulating current generating means includes means for determining the product of a chirping coefficient and a time integral of the modulating current pulse for a time slot; and superimposing means for superimposing the modulating current pulse on a bias current.

2. The semiconductor laser apparatus according to claim 1 wherein said modulating current pulse generating means is responsive to transmission data and includes means for varying said modulating current pulse so as to correspond to 1 or 0 of transmission data.

3. The semiconductor laser according to claim 1 wherein said modulating current pulse generating means includes means for generating a $\delta$ function type.

4. The semiconductor laser apparatus according to claim 1, further comprising:

a self-homodyne detecting circuit means for intensity modulating the phase-modulated output light by converting the phase-modulated output light to a light pulse.

5. The semiconductor laser apparatus according to claim 4 wherein said self-homodyne detecting circuit means comprises a Mach-Zehnder-type interferometer circuit.

6. The semiconductor laser apparatus according to claim 4 wherein said self-homodyne detecting circuit means comprises a Michelson-type interferometer circuit.

7. The semiconductor laser apparatus according to claim 4 wherein said self-homodyne detecting circuit means comprises a Fabry-Perot-type interferometer circuit.

8. The semiconductor laser apparatus according to claim 1 wherein a self-homodyne interference circuit is provided for receiving the phase-modulated output light.

9. The semiconductor laser apparatus according to claim 1, further comprising:
an optical fiber operatively connected to said semiconductor so as to transmit the phase-modulated output light;
a self-homodyne detecting circuit means, operatively connected to said optical fiber, for converting the phase-modulated output light.

10. The semiconductor laser apparatus according to claim 1, further comprising:
light interfering circuit means for dividing the phase-modulated output light through two light paths which have different light path lengths, for combining the divided light so as to provide an intensity modulated output light based on the phase difference between the divided light; and
correcting means for correcting a phase bias of said phase-modulated output light, said correcting means includes
means for obtaining an average intensity of the intensity modulated output light by integrating the intensity of the intensity modulated output light over a time interval corresponding to a speed which is slower than that of said phase modulation; and
feedback means for applying said average intensity to said modulating current generating means.

11. The semiconductor laser apparatus according to claim 1, further comprising:
optical interference circuit means for receiving an input light comprising the phase-modulated output light, for dividing said input light along two optical paths which have different optical path lengths, and for providing an intensity-modulated output light which is subject to an intensity modulation based on the phase difference between the divided light; and
correcting means for correcting a phase bias, said correcting means includes
means for obtaining an average intensity of the intensity-modulated output light by integrating the intensity of the intensity-modulated output light over a time interval corresponding to a speed which is slower than that of said phase modulation, and
feedback means for applying said average intensity to said optical circuit means.

12. The semiconductor laser apparatus according to claim 1, comprising:
sign converting means, responsive to transmission data, for providing a conversion output signal by converting a sign of transmission data only when transmission data comprises either 1 or 0;
a self-homodyne interferometer having an optical delay circuit means for dividing the phase-modulated output light between two light paths, for providing a relative phase difference between the two light paths of 0 or $\pi$ and for providing a relative delay of one time slot;
differentiating circuit means for providing a differentiated output signal by differentiating the conversion output signal; and
driving means for superimposing the differentiated output signal and said bias current.

13. The semiconductor laser apparatus according to claim 12 wherein said differentiating circuit means includes a stub.

14. A semiconductor laser apparatus comprising:
a semiconductor laser; and
modulating means for modulating an output light from said semiconductor laser, said modulating means comprises an optical interferometer circuit for dividing an input light into two, enabling the divided input lights to pass along two light paths capable of modulating the difference in optical path lengths, thereafter recombining the divided input lights, and providing an intensity-modulated output light based on the phase difference produced by the difference in the light path length of the two lights to be combined, and a feedback being applied to the light wavelength of the input light by using an average intensity obtained by integrating an intensity of the intensity-modulated output light in a time interval corresponding to a speed which is slower than that of the modulation, thereby correcting the phase bias at the time of intensity modulation.

15. A semiconductor laser apparatus comprising:
a semiconductor laser; and
modulating means for modulating an output light from said semiconductor laser said modulating means comprises an optical interference circuit that divides an input light into two, enabling the divided input lights to pass along two optical paths capable of modulating the difference in an optical path length and recombining the divided input path length thereafter and providing an output light which is intensity-modulated based on the phase difference in the light path length of the two lights to be combined and a feedback is applied to the light path difference between the two lights paths by using an average intensity obtained by integrating the intensity of the output light of said light interfering circuit in a time interval corresponding to a speed which is slower than that of the modulation, thereby correcting a phase bias at the time of intensity-modulation.

16. A method for modulating a semiconductor laser comprising the steps of:
determining the product of a chirping coefficient and a time integral of a modulating current pulse with regard to one time slot;
phase-modulating an output light from said semiconductor laser by generating the modulating current pulse such that said product is $\pi$ or $-\pi$;
producing a superimposed current by superimposing the modulated current pulse and a bias current;
driving the semiconductor laser with said superimposed current; and
intensity modulating the output light by converting the output light to a light pulse with a self-homodyne-type detecting circuit.

17. A method for modulating a semiconductor, comprising the steps of:
driving a semiconductor laser with a modulating current pulse superimposed on a constant bias current so that an output light from the semiconductor laser is phase modulated according to existence or nonexistence of the modulating current pulse;

producing a phase difference based on an integral of an oscillation frequency by determining the product of a time integral of the modulating current pulse for a time slot and a chirping coefficient.

18. A method for modulating a semiconductor laser according to claim 17, further comprising the step of:
  intensity modulating the output light by converting the output light to a light pulse by using a self-homodyne detector.

* * * * *